United States Patent [19]
Leung

[11] Patent Number: 5,563,418
[45] Date of Patent: Oct. 8, 1996

[54] BROAD BEAM ION IMPLANTER

[75] Inventor: Ka-Ngo Leung, Hercules, Calif.

[73] Assignee: Regents, University of California, Oakland, Calif.

[21] Appl. No.: 362,074

[22] Filed: Feb. 17, 1995

[51] Int. Cl.[6] .................................................. H01J 37/317
[52] U.S. Cl. .................... 250/492.21; 250/492.3
[58] Field of Search ............................. 250/492.21, 492.3

[56] References Cited

U.S. PATENT DOCUMENTS 4,757,208  7/1988  McKenna et al. ................. 250/492.21
5,350,926  9/1994  White et al. ....................... 250/492.21
5,352,899  10/1994  Golovanivsky et al. .......... 250/492.21

*Primary Examiner*—Jack I. Berman
*Attorney, Agent, or Firm*—Pepi Ross

[57] ABSTRACT

An ion implantation device for creating a large diameter, homogeneous, ion beam is described, as well as a method for creating same, wherein the device is characterized by extraction of a diverging ion beam and its conversion by ion beam optics to an essentially parallel ion beam. The device comprises a plasma or ion source, an anode and exit aperture, an extraction electrode, a divergence-limiting electrode and an acceleration electrode, as well as the means for connecting a voltage supply to the electrodes.

16 Claims, 3 Drawing Sheets

BROAD BEAM ION IMPLANTER

This invention was made with U. S. Government support under Contract No. DE-AC03-76SF00098 between the U.S. Department of Energy and the University of California for the operation of Lawrence Berkeley Laboratory. The U.S. Government may have certain rights in this Invention.

BACKGROUND OF THE INVENTION

1. Field of the Invention

This invention relates generally to the field of ion sources and the ion beams extracted from them. More particularly, the invention relates to ion implantation. Yet more particularly the invention relates to ion implantation for flat panel displays.

2. Description of Related Art

Ion implantation into large areas has been attempted in the past by use of an ion shower system, reported by M. Tanjyo, et al. in the article, Development of a Mass Separation Structure for Large Area Ion Source, *Ion Implantation Technology*-92, Proc. 9th Int'l Conference on Ion Implantation Technology, Gainesville, Fla., pg. 445 to 448, Ed. D. F. Downey et al., Elsevier Science Publishers B. V. 1993 and in U.S. Pat. No. 5,189,303: "Ion Source having a Mass Separation Device", M. Tanjyo and H. Nakazato. The ion shower system comprises an approximately parallel ion beam extracted from a multi-hole extraction electrode that gives rise to many parallel beamlets. The array of beamlets yields a beam diameter of 220 mm. It is very difficult with this beamlet system to separate unwanted ion species, that may be generated in the ion source along with the wanted species, out from the final beam. Tanjyo suggested solving this problem by placing a mass spectrometer at each beamlet aperture. This approach is mechanically cumbersome, expensive, and problematic in several other ways.

Another approach to implanting a large area substrate is to produce a small ion beam and scan it back and forth across the substrate. N. Nagai et al. describe a beam scanning system in Sweep Uniformity Control System in the NISSIN NH-20SP, *Ion Implantation Technology*-92, Proc. 9th Int'l Conference on Ion Implantation Technology, Gainesville, Fla., pg. 457 to 460, Ed. D. F. Downey et al., Elsevier Science Publishers B. V. 1993. However a beam scanning system is slow and subject to alignment difficulties which can affect the uniformity of the implantation process. Additionally, as the beam scans across large area substrate, the angle of incidence of ions approaching the substrate changes. This results in problematic changes in ion penetration, density, and uniformity.

A variation in scanning the beam across the substrate is reported by Derek Aitken in his abstract, Ion Implantation Equipment for Flat Panel Displays. He suggests extracting a ribbon beam, by which he presumably means a rectangularly shaped beam, and mechanically scanning the substrate through the beam along a single axis, presumably in the direction of the short axis of the rectangle. This type of system suffers from the disadvantage of being expensive and mechanically cumbersome. It additionally requires more manipulation of the fragile and carefully aligned target than is desirable. In the case of flat panel displays, where the target is a thin glass sheet, the target could be easily damaged by such a process.

SUMMARY OF THE INVENTION

It would advance the state of the art if a single beam could be expanded to a diameter on the order of hundreds of millimeters in a manner that allowed unwanted ion species to be separated out of the beam using a single mass spectrometer. It would be further desirable if beam scanning or target rastering was not necessary. The present invention is an apparatus for creating a large diameter ion beam from a small-diameter diverging beam. The apparatus and method is characterized by extraction of a diverging ion beam and its conversion by ion beam optics to an essentially parallel ion beam. The apparatus comprises an ion source, an ion extraction electrode located at the exit aperture of the ion source, an ion divergence-limiting electrode located downstream from the extraction electrode, a first ion acceleration electrode located downstream from the divergence-limiting electrode, optionally a second ion acceleration electrode located downstream from the first acceleration electrode, and conventional electrical connectors on the electrodes for connecting a voltage source. Either a conducting screen or the voltage applied to the electrodes controls the shape of the plasma boundary and thus the beam divergence and downstream conversion to an essentially parallel ion beam having a diameter between about 10 centimeters and about 100 centimeters at the location of the divergence-limiting electrode.

SUMMARY DESCRIPTION OF THE DRAWINGS

a) flat across the exit aperture (on pervance);

b) concave with respect to the extraction electrode;

c) convex with respect to the extraction electrode; and d) controlled by a conducting screen.

Figure 3:
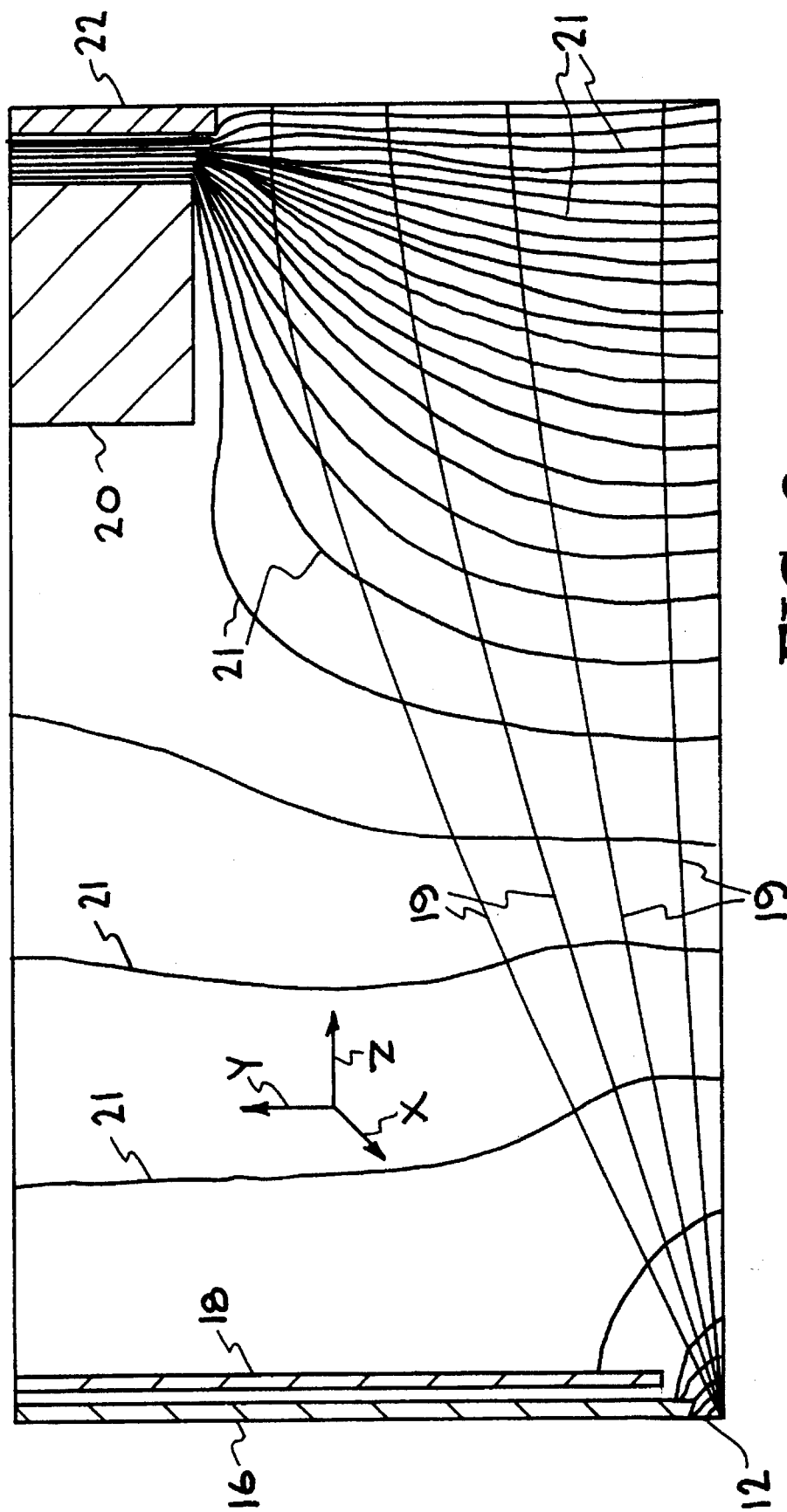

FIG. 3 shows the initial diverging beam giving rise to a final broad parallel beam configuration derived from a computer model based on a three electrode extraction and optics system.

DETAILED DESCRIPTION OF THE INVENTION

The present invention is an apparatus for creating a large diameter ion beam comprising, an ion source, an anode located near of surrounding the exit aperture of the ion source, an ion extraction electrode located in close proximity, downstream from the exit aperture of the ion source, an ion divergence-limiting electrode located downstream from the extraction electrode, a first ion acceleration electrode located downstream from the divergence-limiting electrode, and conventional electrical connectors on the electrodes for connecting a voltage source. The voltage applied to the electrodes controls the shape of the plasma boundary and thus the beam divergence and downstream conversion to an essentially parallel ion beam having a diameter between about 10 centimeters and about 100 centimeters at the location of the divergence-limiting electrode.

Figure 1:
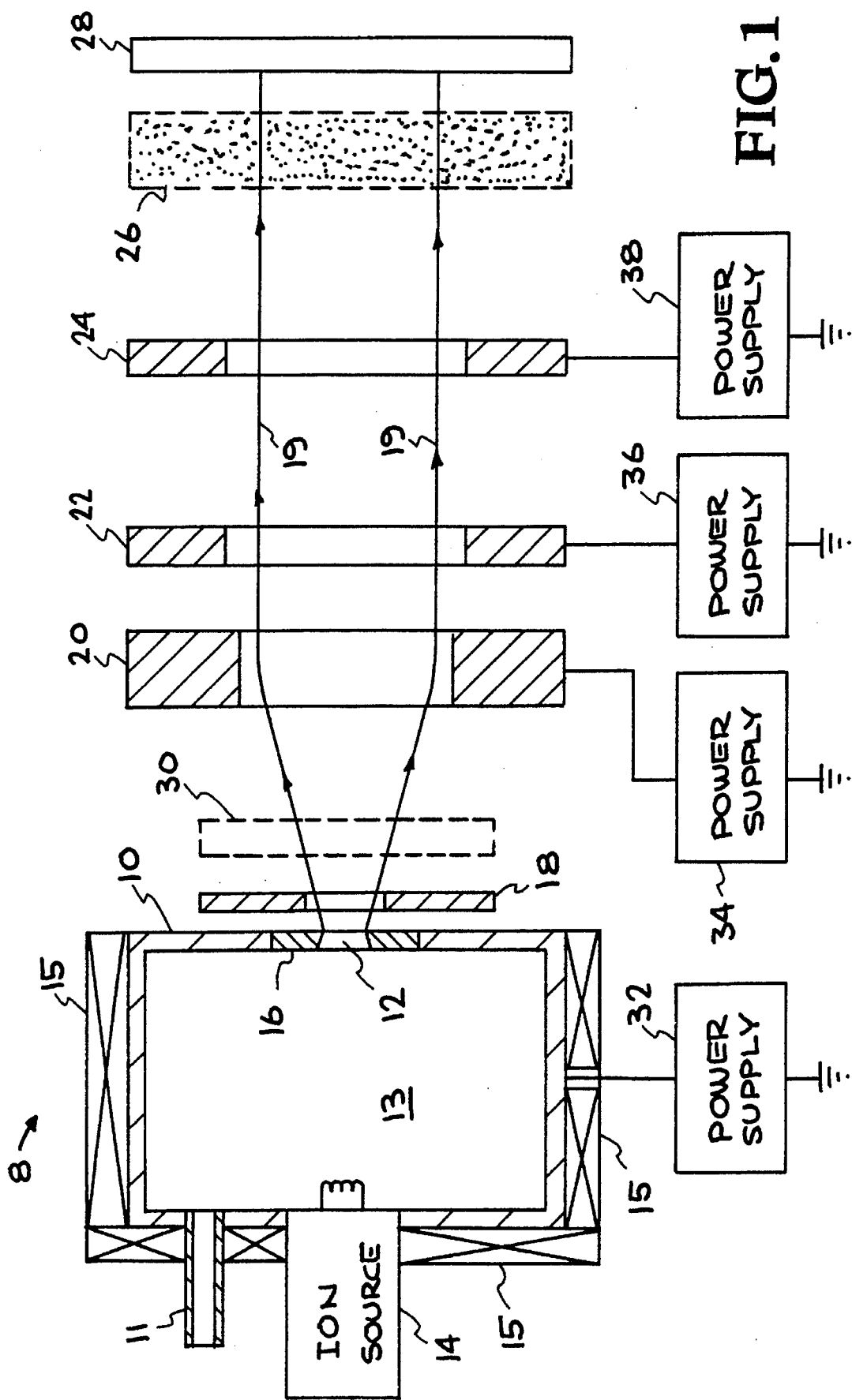
FIG. 1 is a schematic representation of the inventive broad beam ion system.

By use of the term "parallel ion beam" herein is meant a beam of ions wherein, on average, the ions move along a vector that is parallel, within ±5° to the beam axis a. The Ion Source Referring now to the drawings, FIG. 1 illustrates the inventive broad beam apparatus. The ion source 8 is sometimes referred to by those in the art as a plasma chamber. It comprises means for introducing a gas to be ionized into the ion source 11, an exit aperture 12, a means for generating ionizing electrons 14, and means for extracting ions from the ion source 10.

The volume in which the plasma is generated, the plasma chamber, 13 may be formed from, for example, a copper cylinder. The plasma chamber is surrounded by permanent magnets 15 which confine the plasma in a quiescent state with a uniform plasma density profile. There are many types of ion sources and plasma source chambers, many of which can be used in practicing the present invention, see for example, "Handbook of Ion Implantation Technology" ed. by J. F. Ziegler (Elsevier Science Publishers: North-Holland 1992) and two issued patents, both by Leung and Ehlers, U.S. Pat. No. 4,447,732, Magnetic Filter For Bucket Ion Source, and U.S. Pat. No. 4,486,665, Electron Suppressed H-(D-) Volume Produced-Multicusp Source.

There are many means available for generating ionizing electrons for this invention. They are comprised primarily by two categories, direct current (DC) discharge and alternating current (AC) discharge. DC discharge cathodes commonly include tungsten, tantalum, metal oxide, carbon, and lanthanum hexaboride filaments, although other cathode materials can also be used. AC discharge cathodes commonly include radio frequency (RF) induction, microwave, ECR, or laser cathode, although other ac sources can be used. Use of the above electron sources in plasma and ion sources are generally described in the literature, for example in J. F. Ziegler's Handbook of Ion Implantation Technology, North-Holland Press, 1992.

Alternatively, negative ions can be generated by a surface-conversion source. When a surface-conversion source is used, borine ions ($B^-$), phosphine ions ($P^-$), or arsine ions ($As^-$), are generated without use of toxic gases such as $PH_3$, $AsH_3$, and $B_2H_6$. The surface-conversion electrode shape is designed to focus the beam as required by the optics (Ion Source Development at LBL for Ion Implantation Application, Leung, K. N. et al., to be published in Nuclear Instrumentation and Methods, 1995, incorporated herein by reference.

The exit aperture 12 is located in a conducting material that forms the anode 16 and is incorporated in the ion source housing 10. Examples of exit aperture design can be found in J. F. Ziegler's Handbook of Ion Implantation Technology and in patent application Ser. No. 07/875,778 by O. Andersen, C. F. Chang, and K. N. Leung, now U.S. Pat. No. 5,365,070, incorporated herein by reference.

B. Extraction Electrode

Figure 2A:
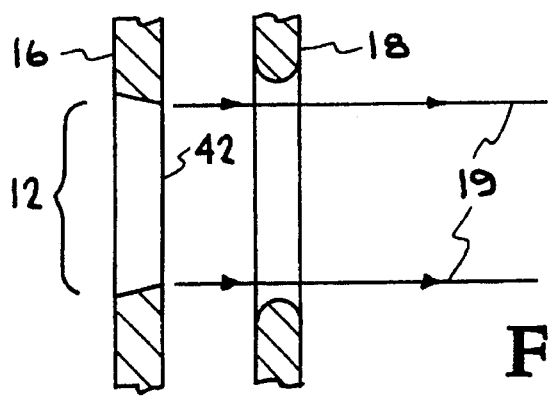
FIG. 2 is a schematic illustration of the shape of the plasma at the exit aperture under conditions when the plasma boundary is.
Figure 2B:
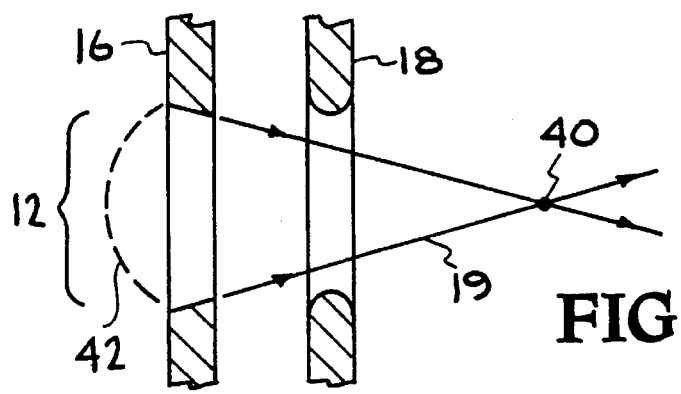
Figure 2C:
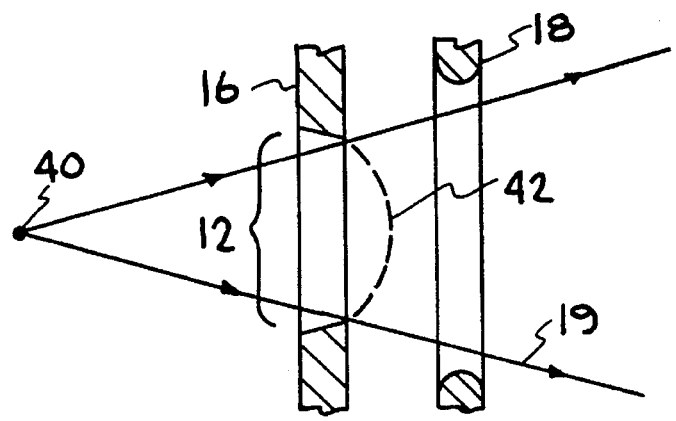

FIGS. 2a through 2d illustrate an enlarged cross-sectional view of the exit aperture 12 located in the anode 16 of the ion source housing 10. An extraction electrode 18 is located immediately downstream of the anode. The surface shape of the beam 19 as it emerges from the exit aperture is dependent on: a) the potential applied to the extraction electrode relative to the anode, b) the mass and charge of the ions, and c) the density of the plasma. The geometry and location of the extraction electrode and the potential applied to it and other optics electrodes surrounding the extracted beam control shape of the plasma as it exits the anode through the exit aperture. Controlling the surface shape of the extracted plasma is thoroughly discussed in Ziegler's Handbook of Ion Implantation Technology, pages 471 to 520. For the present invention it is preferable for the plasma surface facing the extractor to be convex (FIG. 2c). The optical electrode system 20, 22, and optionally 24, placed downstream from the exit, functions correctly and reliably only if the shape of the plasma surface at the exit aperture is known and controlled. The shape of the plasma extraction surface essentially determines the optical quality of the extracted ion beam. This is discussed in more detail in Robert Simonton's chapter of Ziegler's "Handbook of Ion Implantation Technology", particularly on pages 517 to 520. The standard configuration and extraction method, described by Simonton teaches that adjusting the electric field strength, gap between anode and extractor, or plasma density until the plasma shape is approximately flat will yield the best results. The current invention, in contrast, preferably has a plasma surface that is convex with respect to the extractor. As Simonton points out, the beam current and beam optical quality is dominated by the shape of the extraction surface at the plasma chamber exit aperture. The effects of any optical system of electrodes placed downstream from the extraction electrode can only be calculated if the shape of the plasma boundary is known.

In contrast to ion implanters in the prior art, which extracted parallel ion beams, the ion implanter of the present invention extracts a diverging ion beam. The diverging beam is created by setting the variables of plasma density in the ion source plasma chamber, electrical potential on the extraction electrode, and radius of curvature of an optional conducting screen placed in the exit aperture so that the shape of the plasma boundary at the exit aperture is convex with respect to the extraction electrode, as shown in FIG. 2C.

For a given plasma density, positive ions form a convex plasma boundary facing the extraction electrode when the extraction electrode is sufficiently negative with respect to the anode. The more negative the extraction electrode is, the greater the radius of curvature of the convex plasma boundary is. Alternatively, for a given plasma density, negative ions form a convex plasma boundary facing the extraction electrode when the extraction electrode is sufficiently positive with respect to the anode. For negative ions, the more positive the extraction electrode is, the greater the radius of curvature of the convex plasma boundary is.

The shape of the plasma boundary at the exit aperture is also controlled by the plasma density. For a given electrical potential on the extraction electrode, increasing the plasma density increases the radius of curvature of the convex plasma boundary.

Figure 2D:
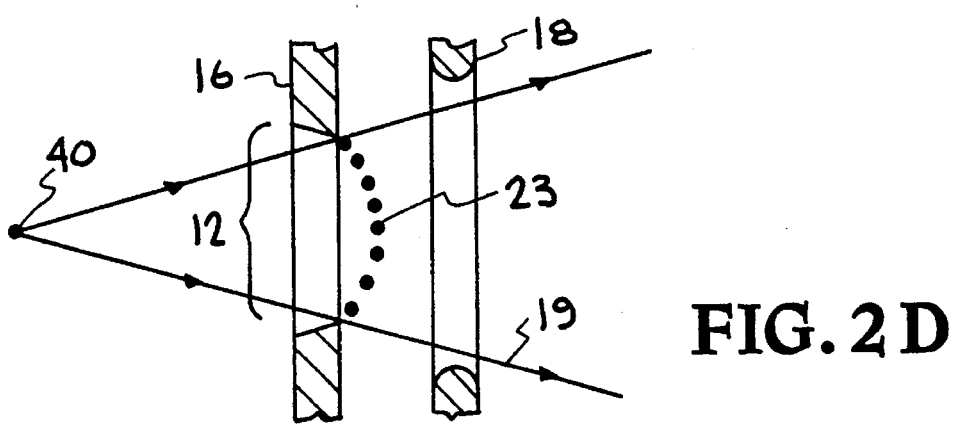

Yet another way to create a plasma boundary that has a convex shape facing the extraction electrode is to place a conducting screen 23 of the desired radius of curvature across the exit aperture as shown in FIG. 2d. This is the preferred manner for creating the appropriate shape of the plasma boundary because it provides a stable radius of curvature. The screen is constructed from tungsten, molybdenum, tantalum, stainless steel, graphite, and their alloys, or other conducting materials of suitable electrical conductivity and mechanical strength. The screen transparency is preferably between about 50% and about 95%. At the lower transparency value beam current can be adversely affected and at the higher transparency value the screen lifetime may be undesirably short and the shape of the electric field may not be controlled adequately. Thus, more practically, the screen transparency is between about 65% and about 85%. Most preferably the screen transparency is about 75%. Additionally the configuration of hole sizes in the screen may be varied to achieve homogeneity in the final beam. For example, if the holes may be larger toward the periphery of the screen if that is necessary to achieve a homogenous ion density across the diameter of the final broad beam.

When the plasma boundary is shaped to provide a convex plasma surface facing the extractor, the beam shape then conforms to the shape it would have if it diverged from a point source at the focal point 40 of the plasma boundary curve. The focal point 40 can be changed by changing the radius Of curvature of the plasma boundary. For a given ion implantation application the focal point and divergence, or aspect ratio, is set to deliver the appropriately shaped beam for the optics used downstream. The divergence will be determined by the location of the focal point 40 and the diameter of the exit aperture. The focal point location is determined to accommodate a particular beam divergence required for a given aspect ratio. The aspect ratio is the ratio of the diameter of the parallel beam and the diameter of the exit aperture. Tradeoffs to consider when deciding what aspect ratio and screen curvature to use are the size of the source and the length of the optics. A smaller radius of curvature places the beam focal point within the plasma chamber, but closer to the exit aperture than a larger radius of curvature. The closer the focal point is to the exit aperture, the larger the beam divergence is. The farther the focal point is from the exit aperture, that is the deeper it resides within the plasma chamber, the larger the ion source volume must be. These tradeoffs are well known to practitioners in the art of ion source design and ion implantation instrumentation.

c. Ion Beam Optics

Impurities in the extracted ion beam are eliminated by use of a single mass spectrometer placed immediately downstream of the extraction electrode. Ion impurities, including but not limited to $O_2$, C, CO, $CO_2$, N, and metals, are removed by using a mass spectrometer filter 30, also referred to as an E x B filter. The ion beam travels in the direction of the Z axis, perpendicular to the plane of the exit aperture. As represented in FIG. 3, the Y axis is vertical and the X axis is perpendicular to the sheet of the figure. The E x B filter applies a second E field in the positive Y direction, perpendicular to the E field imposed by the extraction and optical electrodes. The magnetic field, B, is applied in the X direction. As particles move though the E x B field of the filter, they are deflected in the Y direction from their original path according to their mass and charge. An additional E field is applied that is just strong enough to counteract the deflecting effect of the filter for those ions that are retained to comprise the beam. The filter imposes a v X B force on the ions, where E, the applied electric field, causes the ions to move with velocity v parallel to E and B is a magnetic field applied perpendicularly to E. An alternative approach is to operate the ion source so that only the desired target molecules are ionized and extracted into the beam, according to the inventive method described in U.S. Pat. No. 5,517,084, entitled, Selective Ion Source, by Ka-Ngo Leung and incorporated herein by reference.

The extraction electrode 18 and other electrodes, 20 and 22, located downstream of the exit aperture 12 and anode 16, are geometrically configured and biased with an electrical potentials that shape the extracted ion beam to the desired configuration. Precise placement and voltages are calculated using WOLF software, available from the inventor. Power supplies 32, 34, 36, and 38 are used to bias the extraction electrodes appropriately. Optionally additional electrodes, such as 24, can be used to further control the shape and energy of the beam. The ions' charge is neutralized in immediate proximity to the target or substrate to be implanted 28 by a diffuse gas 26. The diffuse gas is typically the same gas used for the plasma and is typically used at the same density for neutralization as the density in the plasma chamber. Other gases can be used however at densities between about $2\times10^{13}$ particles per cubic centimeter and about $6\times10^{13}$ particles per cubic centimeter. Any easily ionizable gas can be used. Inert gasses such as Xenon and Argon are preferable.

A small diameter beam for example, about 0.8 cm. is extracted through the exit aperture of the ion source. Depending on the ions and methodology used, unwanted ions or electrons are eliminated from the beam by use of a mass filter or mass spectrometer. The beam diverges as a function of the focal point location and exit aperture diameter as it is accelerated to the extraction ring electrode 18. The voltage difference between electrode 18 and electrode 20 is relatively small. Electrode 20 has an inside diameter somewhat greater than the final diameter of the ion beam, as do all of the electrodes downstream from it.

EXAMPLE

To further illustrate the invention, the effect of electrodes and exit aperture configured according to the invention on an ion beam was modeled by a set of equations calculated on a CRAY computer using the WOLF optics code. These codes are briefly described and referred to in a paper authored by the inventors and are incorporated herein by reference, (Low-energy injector design for SSC, by O. A. Anderson, C. F. Chan, K. N. Leung, L. Soroka, and R. P. Wells, Rev. Sci. Instru. V 63, pg 2738, 1992). Copy of the code is available from the inventor.

FIG. 3 illustrates the results of the computer modeling. The boundary conditions comprised location, dimensions, and voltage of the electrodes. The electrodes are in the shape of rings with the beam line passing through their central aperture. The width of the electrode refers to the dimension measured along a radius from its outer circumference to its aperture. The anode 16 was biased with 40 kilovolts (kV); the extraction electrode 18 was biased at 26 kV; electrode 20 was biased with 23 kV, and electrode 22 was held at ground, that is 0 kV. The extraction electrode was located 0.5 cm downstream from the anode and was about 0.25 cm thick. The aperture in the anode was about 0.4 cm. in radius; that constrained the initial beam radius to about 0.4 cm. radius. The extraction electrode aperture was about 1.5 cm. in radius. The upstream edge of the first optical electrode 20 was located about 37.25 cm. downstream of the downstream edge of the extraction electrode. Electrode 20 was 9.0 cm thick, about 7 cm wide (that is extended about 7 cm into the beam line), and had an aperture of about 20 cm.; electrode 22 was about 1 cm thick, about 8 cm wide, and had an aperture of about 19 cm radius; it's upstream edge of was located about 2.0 cm. downstream of the downstream edge of electrode 20.

The lines that generally run more vertically in the figure are lines of equal electric potential 21; the lines generally shown running left to right, shown diverging from the exit aperture 12 and becoming approximately parallel at the aperture of electrode 22, represent the trajectory of positive-ions in the beam path 19. This beam trajectory was calculated for the particular electrode placements, sizes and applied voltages, and using computer code based on standard principles of physics and electronics. The conditions for this experiment based on a $PH_3^+$ current, $j_o$, at the exit aperture of about 16 $mA/cm^2$, ion charge of +1, ion mass of 34 amu, an initial beam radius of about 0.4 cm; and a final beam radius of about 15 cm, with final beam energy of about 40 KeV.

Screens with a screen transparency of 75% were made from tungsten and from molybdenum, in order to control the shape of the plasma boundary 42 at the anode exit aperture.

There are many other commonly known metals and metal alloys from which the screens can be made, such as, for example, stainless steel.

Thus, the invention provides an apparatus and method to create large diameter, uniform beam of ions.

The description of illustrative embodiments and best modes of the present invention is not intended to limit the scope of the invention. Various modifications, alternative constructions and equivalents may be employed without departing from the true spirit and scope of the appended claims.

Having thus described the invention, I claim:

1. An apparatus for ion implantation comprising,
   a) an ion source having an exit aperture;
   b) an anode located at the ion source exit aperture;
   c) a plasma boundary shaping element which forms a plasma boundary which is convex in two orthogonal directions located in the exit aperture;
   d) an extraction electrode, located downstream from the anode;
   e) an ion beam divergence-limiting electrode located downstream from the extraction electrode;
   f) an ion acceleration electrode located downstream from the divergence-limiting electrode;
   g) means to connect one or more voltage sources to the anode and electrodes.

2. The apparatus of claim 1 wherein
   a) the anode potential is between about 30 kV and about 50 kV relative to the acceleration electrode;
   b) the extraction electrode potential is between about 20 kV and about 32 kV relative to the acceleration electrode;
   c) the divergence-limiting electrode potential is between about 16 kV and about 30 kV relative to the acceleration electrode.

3. The apparatus of claim 2 wherein
   a) the anode potential is about 40 kV relative to the acceleration electrode;
   b) the extraction electrode potential is about 26 kV relative to the acceleration electrode;
   c) the divergence-limiting electrode potential is about 23 kV relative to the acceleration electrode.

4. The apparatus of claim 1 wherein the plasma shaping element is an electric field from the voltage applied to the extraction electrode.

5. The apparatus of claim 4 wherein the extraction electrode has a voltage sufficient to create a convex plasma boundary at the exit aperture.

6. The apparatus of claim 1 wherein the plasma boundary shaping element is a conducting screen.

7. The apparatus of claim 6 wherein the conducting screen comprises molybdenum, tantalum, stainless steel, graphite, or alloys thereof.

8. The apparatus of claim 6 wherein the screen transparency is between about 50% and about 95%.

9. The apparatus of claim 8 wherein the screen transparency is between about 65% and about 85%.

10. The apparatus of claim 9 wherein the screen transparency is about 75%.

11. The apparatus of claim 1 further comprising a diffuse gas located at the surface of an implant target.

12. The apparatus of claim 11 wherein the diffuse gas has a density of between $2 \times 10^{13}$ particles per cubic centimeter and $6 \times 10^{13}$ particles per cubic centimeter.

13. The apparatus of claim 11 wherein the diffuse gas is the same gas ionized in the ion source volume.

14. The apparatus of claim 1 wherein a mass spectrometer filter is located between the extraction electrode and the divergence-limiting electrode.

15. The apparatus according to claim 1 additionally comprising a second ion acceleration electrode located down stream from the first acceleration electrode.

16. A method for producing a large diameter ion beam comprising the steps of,
   a) applying an electric potential to an anode located at or near an ion source exit aperture;
   b) applying an electric potential to an extraction electrode;
   c) shaping the plasma boundary at the exit aperture to be convex with respect to the extraction electrode;
   d) applying an electric potential to a divergence-limiting electrode sufficient to convert a diverging ion beam to an essentially parallel ion beam;
   e) applying an electric potential to an acceleration electrode to adjust the desired energy of the ion beam.

* * * * *